United States Patent [19]

Lim et al.

[11] Patent Number: 4,972,100

[45] Date of Patent: Nov. 20, 1990

[54] DATA OUTPUT BUFFER CIRCUIT FOR BYTE-WIDE MEMORY

[75] Inventors: Hyung-Kyu Lim; Hyong-Gon Lee, both of Seoul; Keon-Soo Kim, Kimhae, all of Rep. of Korea

[73] Assignee: Samsung Electronics Co., Ltd., Seoul, Rep. of Korea

[21] Appl. No.: 332,005

[22] Filed: Mar. 31, 1989

[30] Foreign Application Priority Data

Jul. 10, 1988 [KR] Rep. of Korea ............... 88-8952

[51] Int. Cl.⁵ ............... H03K 17/16; H03K 19/017; H03K 19/094
[52] U.S. Cl. ............... 307/443; 307/448; 307/450; 307/451; 307/570; 307/263
[58] Field of Search ............... 307/443, 448, 450, 451, 307/570, 263

[56] References Cited

U.S. PATENT DOCUMENTS 4,816,705  3/1989  Ohba et al. .................. 307/570

FOREIGN PATENT DOCUMENTS 0068304  6/1977  Japan .................. 307/450

Primary Examiner—Stanley D. Miller
Assistant Examiner—Margaret Rose Wambach
Attorney, Agent, or Firm—Morgan & Finnegan

[57] ABSTRACT

An output buffer circuit for a byte wide memory is disclosed, including a circuit for delaying the falling or rising time of the gate voltage of a pull-up transistor of an output driver, located between a p-channel transistor and an n-channel transistor of the pull-up inverter; and a circuit for delaying the rising time of the gate voltage of a pull-down transistor of the output driver, located between a p-channel transistor and an n-channel transistor of the pull-down inverter. The disclosed delay circuits may include a depletion transistor having a gate and a source connected to each other. Through the provision of such delay mechanisms, the noise generations in both the power lines and the ground lines are reduced.

5 Claims, 3 Drawing Sheets

DATA OUTPUT BUFFER CIRCUIT FOR BYTE-WIDE MEMORY

FIELD OF THE INVENTION

The present invention relates to a data output buffer circuit for semiconductor memories having a plurality of input/output terminals, and more particularly to an improved data output buffer circuit for high speed byte-wide memories, in which the noise generated in the circuit can be greatly suppressed.

BACKGROUND OF THE INVENTION

To make it possible for a semiconductor device to be operated at a high speed, fast charging/discharging of the capacitive load is required. Especially, in a conventional output buffer circuit (FIG. 1) of a memory device which is provided with numerous input/output terminals, a large value of di/dt is accompanied during the concurrent transitions of input/output data. Such a large value of di/dt causes noise both in the power line and the ground line to be produced. Further, as the power source voltage becomes higher and the temperature is lowered, the noise is increased.

This will adversely affect the TTL compatible input buffer, resulting in the chips becoming liable to give faulty operations, noise-sensitive circuitries such as sense amplifiers and the like also becoming liable to malfunction.

In an effort to give solution to the said problems, a circuit as shown in FIG. 2 was proposed. That is, as described in "A 21ns 32K×8 CMOS Static RAM With A Selectively Pumped p-Well Array," *IEEE Journal of Solid-State Circuits*. Vol. SC-22, No. 5 (Oct. 1987), an active resistance is inserted into the inverter located upstream of the output driver, as a means for reducing the noise in the output buffer. In such a device, some noise reductions may be obtained by inserting resistances R1–R4 into the source of the p-channel MOS pull-up device and into the source of the n-channel MOS pull-down device. However, in such a device, adverse effects are produced such that the access time, i.e., the operation speed becomes slow in the overall evaluation.

SUMMARY OF THE INVENTION

Therefore, it is an object of the present invention to provide a data output buffer circuit in which the noise generations in the power line and the ground line are minimized at the condition of the high power source voltage and low temperature that would cause the highest probability of noise generations, while the operation speed does not slow down, as compared with the conventional one, at the condition of the low power source voltage and high temperature that would result in the lowest chip operation speed.

In achieving these and other objects of the invention, the circuit of one embodiment of the present invention includes a pull-up CMOS inverter having a p-channel transistor and an n-channel transistor interconnected in series; a pull-down CMOS inverter having a p-channel transistor and an n-channel transistor interconnected in series; and an output driver consisting of a pull-up transistor and a pull-down transistor interconnected in series, both of them forming a push-pull transistors. The pull-up transistor has a gate for being coupled with the output node of the pull-up CMOS inverter, the pull-down transistor has a gate for being coupled with the output node of the pull-down CMOS inverter, and the output driver drives a capacitive load in response to pull-up and pull-down signals applied to the respective inputs of the pull-up CMOS inverter and the pull-down CMOS inverter.

The invention further includes means for delaying the falling time or the rising time of the gate voltage of the pull-up transistor to be activated within the output driver, said delaying means being provided between the p-channel transistor and the n-channel transistor of the pull-up inverter. A means for delaying the rising time of the gate voltage of the pull-down transistor to be activated within the output driver is provided between the p-channel transistor and the n-channel transistor of the pull-down inverter.

The delay means will function in such a manner that, under the low power source voltage and high temperature, they will have a current driving capability the same as or larger than those of p- and n-channel transistors of the aforementioned inverters. Moreover, under the conditions of high power source voltage and low temperature, the delay means will have a current driving capability smaller than those of the p- and n-channel transistors.

In one embodiment of the present invention, as a means for satisfying the above-mentioned requirements, a depletion transistor may be provided, of which the gate and the source terminals are connected to each other, and which presents saturation characteristics above a certain level of the power source voltage.

According to the data output buffer circuit of the present invention, the depletion transistor, under the conditions of low power source voltage and high temperature, will have a current driving capability larger than those of the p- and n-channel transistors of the said inverters, thereby preventing the retardation of the data reading speed, if any, accompanied by the insertion of the depletion transistor. Further, under the conditions of a high power source voltage and low temperature, the depletion transistor will have a certain current driving capability smaller than those of the p- and n-channel transistors of the inverters, thereby suppressing the generation of noise in the power line and the ground line.

BRIEF DESCRIPTION OF THE DRAWINGS

The above objects, advantages and other features of the present invention will become more apparent by describing the preferred embodiments of the present invention with reference to the attached drawings in which.

DETAILED DESCRIPTION OF THE DRAWINGS

Figure 1:
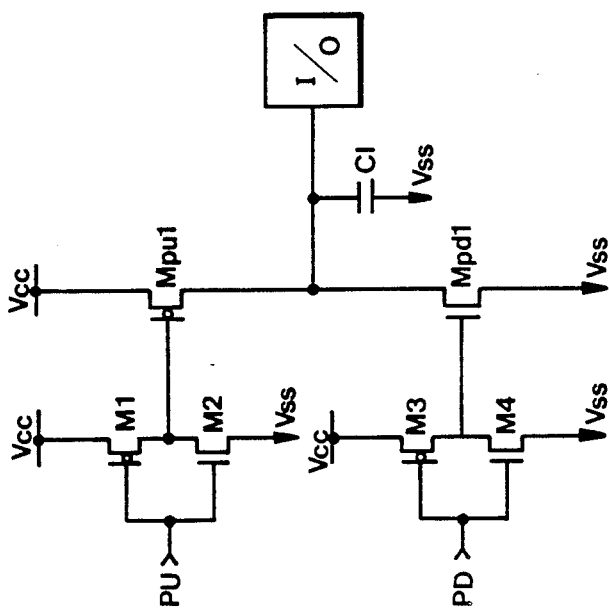
FIG. 1 illustrates a conventional data output buffer circuit.
Figure 3B:
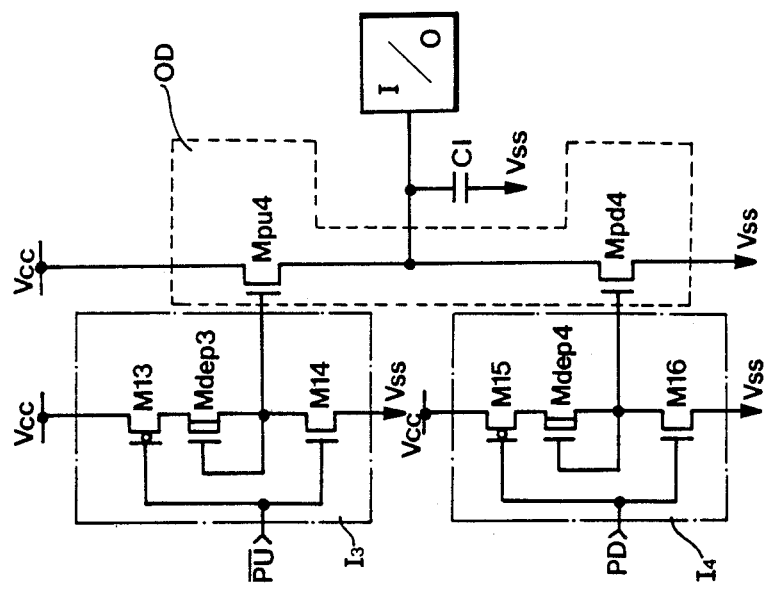
FIGS. 3A and 3B illustrate respectively embodiments of the data output buffer circuit according to the present invention.
Figure 3A:
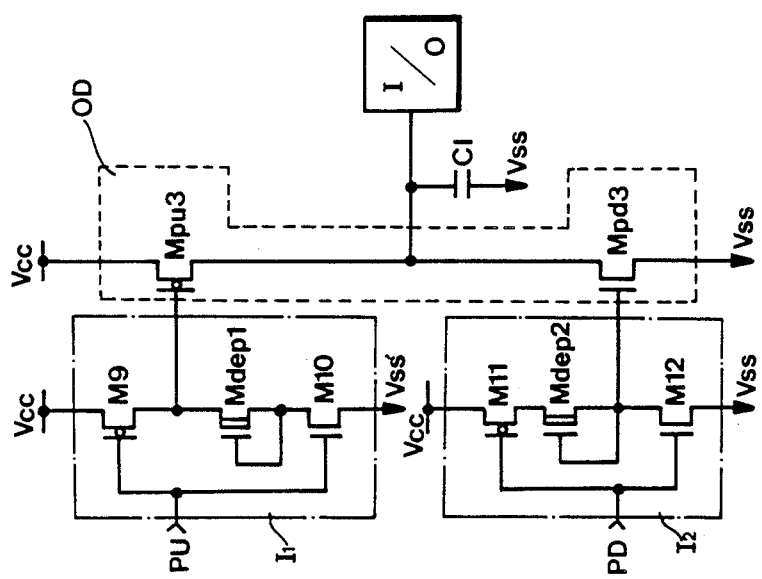

FIG. 3 shows the data output buffer circuit adopting depletion transistors according to the present invention. The gate and the source of each of the depletion transistors connected to each other (Vgs=o) are inserted into each of CMOS inverters of the push-pull type as shown in FIG. 1. More specifically, FIG. 3A shows an embodiment in which the pull-up transistor Mpu3 within the output driver consists of a p-channel transistor, while FIG. 3B shows another embodiment in which the pull-up transistor Mpu4 within the output driver consists of an n-channel transistor. Accordingly, a normal pull-up signal PU is fed into the pull-up inverter I1 of FIG. 3A, while an inverted pull-up signal $\overline{PU}$ is fed into the pull-up inverter I3 of FIG. 3B.

In the first embodiment of the present invention as illustrated in FIG. 3A, the pull-up CMOS inverter I1 includes a p-channel transistor M9 and an n-channel transistor M10, these transistors being of an enhancement type. A depletion transistor Mdep1 of which the gate and the source are connected to each other is installed in such a manner that its drain is connected to the drain of the p-channel transistor M9 and its source is connected to the drain of the n-channel transistor M10. The connection node between the p-channel transistor M9 and the depletion transistor Mdep1 is an output terminal of the pull-up inverter I1, which is connected to the gate of the p-channel pull-up transistor Mpu3 within the output driver OD. Accordingly, the depletion transistor Mdep1 can delay the falling time of the gate voltage of the pull-up transistor Mpu3 to be activated.

Meanwhile, the pull-down CMOS inverter I2 also includes a p-channel enhancement transistor M11 and an n-channel enhancement transistor M12. A depletion transistor Mdep2 is also installed between the transistors M11 and M12. In the inverter I2, the connection node between the depletion transistor Mdep2 and the n-channel transistor M12 is an output terminal which is connected to the gate of the n-channel pull-down transistor Mpd3 within the output driver OD. Accordingly, the depletion transistor Mdep2 can delay the rising time of the gate voltage of the n-channel pull-down transistor Mpd3 to be activated.

The two depletion transistors Mdep1 and Mdep2 are designed with an aspect ratio such that the said two transistors should have a current driving capability which is the same as or larger than those of the p- and n-channel transistors of the inverters I1 and I2 under the conditions of a low power source voltage and high temperature.

Further, the connection node between the p-channel transistor Mpu3 and the n-channel transistor Mpd3 in the output driver OD is connected to the capacitive load C1 to charge/discharge it, and is also connected to one of the input/output terminals of the memory device.

Generally, the peak values of the noise in the power line and the ground line are very large when the data output driver OD is turned on. Therefore, in the first embodiment according to the invention shown in FIG. 3A, the rising time of the gate voltage of the pull-down transistor Mpd3 is delayed to suppress the noise in the ground line to an optimum level. Further, the falling time of the gate voltage of the pull-up transistor Mpu3 and the rising time of the gate voltage of the pull-down transistor Mpd3 are delayed simultaneously to suppress the noise in the power line at an optimum level.

FIG. 3B illustrates the second embodiment of the present invention. In this embodiment, in contrast to the first embodiment of FIG. 3A, a pull-up transistor Mpu4 forming a part of the output driver OD comprises an n-channel transistor. The connection node between the drain of a depletion transistor Mdep3 and the drain of the n-channel enhancement transistor M14 installed within a pull-up inverter I3 comprises an output terminal of the inventer I3, which is connected to the gate of the n-channel pull-up transistor Mpu4. Accordingly, the circuit of FIG. 3B would be suitably used for feeding the inverted pull-up signals $\overline{PU}$ as the input of the pull-up inverter I3 and the depletion transistor Mdep3 can delay the rising time of the gate voltage of the n-channel pull-up transistor Mpu4 to be activated.

Figure 2:
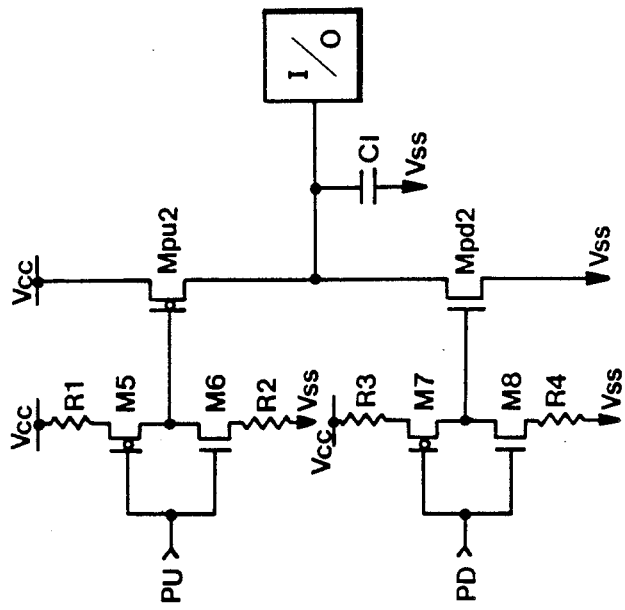
FIG. 2 illustrates another data output buffer circuit according to the conventional technology.
Figure 4A:
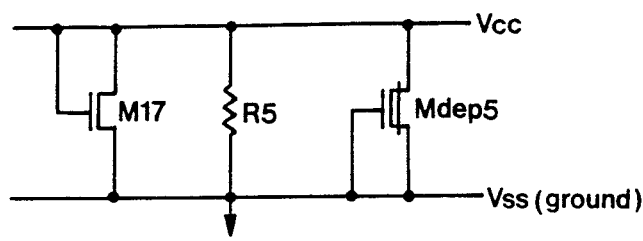
FIG. 4 shows the current-voltage characteristics of the enhancement transistor, the resistor and the depletion transistor which are adopted in the data output buffer circuits of FIGS. 1 to 3, respectively.
Figure 4B:
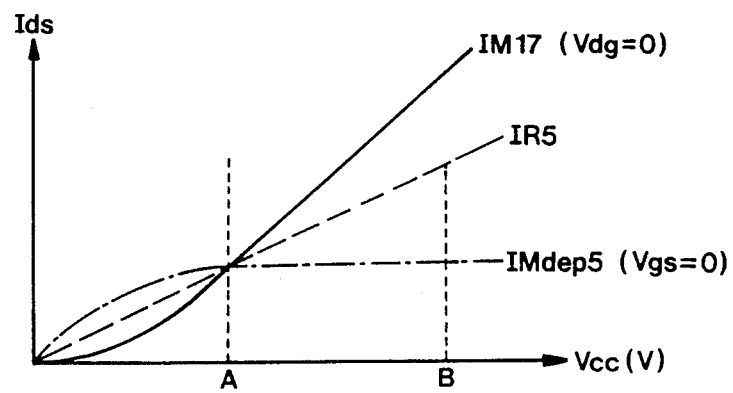

FIG. 4 illustrates the critical features of the circuits of FIGS. 1, 2 and 3, in which enhancement transistors, resistors and depletion transistors are used respectively. FIG. 4 also illustrates graphical comparisons of current-voltage characteristics of the three cases. FIG. 4 thus illustrates the effects of the adoption of the depletion transistor according to the present invention.

In the case where an enhancement transistor M17 is used, Ids is proportional to $(Vds-Vt)^2$, where Ids indicates the drain-source current, Vds the drain-source voltage, and Vt the threshold voltage. Accordingly, the current is steeply increased at a high Vds(=Vcc), and therefore, as described above, noise generation is greatest in the range of a high power source voltage.

Next, in the case where the resistance R5 is used, Ids is increased linearly relative to Vcc, thereby making it possible to reduce the noise to a certain extent compared with the case where the enhancement transistor is used.

Meanwhile, in the case where the depletion transistor Mdep5 is used, this transistor reaches a saturation above a certain level of Vds(=Vcc), so that Ids should be maintained at a constant level. The turning-on speed of the data output driver is proportional to Ids of the MOS transistor forming a part of the inverter located upstream of the output driver. Therefore, even in cases where the circuits of FIGS. 1 and 3 have been implemented to operate at the same speed under the low power source voltage (for example, Vcc of the point A indicating about 4 volts) it is seen that the output buffer circuit adopting the depletion transistors according to the present invention (as illustrated in FIG. 3) shows much less steep variations of the operation current even under a high power source voltage of the point B indicating about 7 volts, as compared with the conventional output buffer circuit simply using the enhancement transistors as shown in FIG. 1, owing to the fact that the current in the former is limited to a certain level at a high power source voltage.

Meanwhile, as described above, the noise in the power line and the ground line is proportionate to di/dt. Therefore, the output buffer circuit adopting the depletion transistors according to the present invention is capable of effectively suppressing the noise at a high power source voltage.

Figure 5:
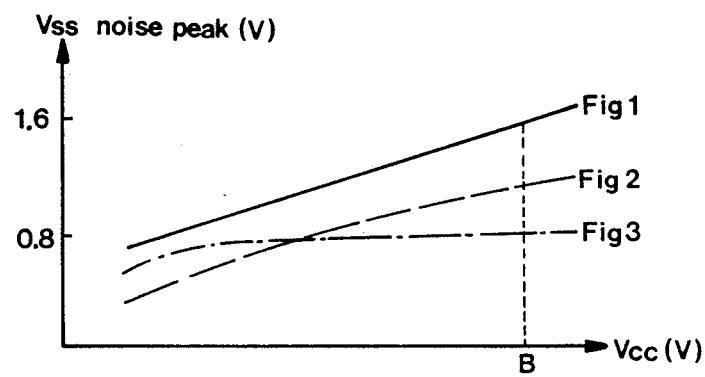
FIG. 5 illustrates a graph showing the relationship of the noise characteristics of the ground lines and the variation of the power source voltage in the respective circuits of FIGS. 1 to 3, in case the circuits are implemented to be operated at the same speed.

FIG. 5 illustrates the noise levels for the circuits of FIGS. 1 to 3, in which enhancement transistors, resistors and depletion transistors are used, respectively. More specifically, this drawing shows the peak values of the noise of the ground lines measured by varying the power source voltage at a low temperature, having started under the condition that the different circuits are made to be operated at the same speed at a high temperature and a low voltage at which the operation speed is lowest.

As shown in FIG. 5, at the high power source voltage Vcc of the point B indicating about 7 volts, which is determined based on the aspect ratio of a transistor, the conventional output buffer circuit of FIG. 1 produces a peak noise value of 1.6 V in the ground line. Meanwhile the output buffer circuit according to the present invention (as shown in FIG. 3) produces a peak noise value of 0.8 V in the ground line, with the result that a noise suppression effect of about 50% is obtained compared with the case of the conventional output buffer circuit.

As described above, the present invention provides a depletion transistor in each of the inverters located upstream of the data output driver, with the result that the noise generations both in the power line and in the ground line are reduced to a minimum at the high voltage and low temperature conditions. Further, the operation speed in the circuit according to the invention is not aggravated at the low power source voltage and high temperature conditions as compared with the conventional circuits.

Although the invention has been described in detail by way of reference to the embodiments disclosed herein, the invention is not limited to the disclosed embodiments and should be interpreted only in accordance with the claims which follow.

What is claimed is:

1. An output buffer circuit for a byte wide memory, comprising:
    a pull-on CMOS inverter having a p-channel transistor and an n-channel transistor interconnected in series,
    a pull-down CMOS inverter having a p-channel transistor and an n-channel transistor interconnected in series,
    an output driver having a pull-up transistor and a pull-down transistor interconnected in series, said pull-up transistor having a gate for being connected to an output node of said pull-up CMOS inverter, said pull-down transistor having a gate for being connected to an output node of said pull-down CMOS inverter and an output of said output driver driving a capacitive load in response to pull-up and pull-down signals applied to respective inputs of said pull-up CMOS inverter and said pull-down CMOS inverter,
    first delay means for delaying falling time or rising time of gate voltage of the pull-up transistor to be activated within the output driver, said first delay means being installed between the p-channel transistor and the n-channel transistor of said pull-up inverter, and
    second delay means for delaying the rising time of the gate voltage of the pull-down transistor to be activated within the output driver, said second delay means being installed between the p-channel transistor and the n-channel transistor of said pull-down inverter,
    wherein said first and second delay means have a current driving capability equal to or greater than that of said p- and n-channel transistors of said inverters at a low power source voltage and high temperature and wherein said first and second delay means have a current driving capability smaller than those of said p- and n-channel transistors at a high power source voltage and low temperature.

2. The output buffer circuit as claimed in claim 1, wherein each of said delay means includes a depletion transistor having a gate and a source connected to each other.

3. The output buffer circuit as claimed in claim 2, wherein the pull-up transistor within said output driver is a p-channel transistor, and wherein the connecting node between the p-channel transistor and the depletion transistor within said pull-up inverter is operably connected to the gate of said p-channel pull-up transistor within said output driver, whereby said depletion transistor may delay the falling time of the gate voltage of said p-channel pull-up transistor to be activated.

4. The output buffer circuit as claimed in claim 2, wherein the pull-up transistor within said output driver is an n-channel transistor, and wherein the connecting node between the n-channel transistor and the depletion transistor within said pull-up inverter constitutes the output terminal of said pull-up inverter, said connecting node being connected to the gate of the n-channel pull-up transistor within the said output driver, whereby the said depletion transistor may delay the rising time of the gate voltage of said n-channel pull-up transistor to be activated.

5. The output buffer circuit as claimed in any one of claims 2, 3 or 4, wherein the connecting node between the n-channel transistor and the depletion transistor within said pull-down inverter constitutes the output terminal of said pull-down inverter, and is connected to the gate of the n-channel pull-down transistor within said output driver, whereby said depletion transistor may delay the rising time of the gate voltage of said n-channel pull-down transistor to be activated.

* * * * *